Figure 1:
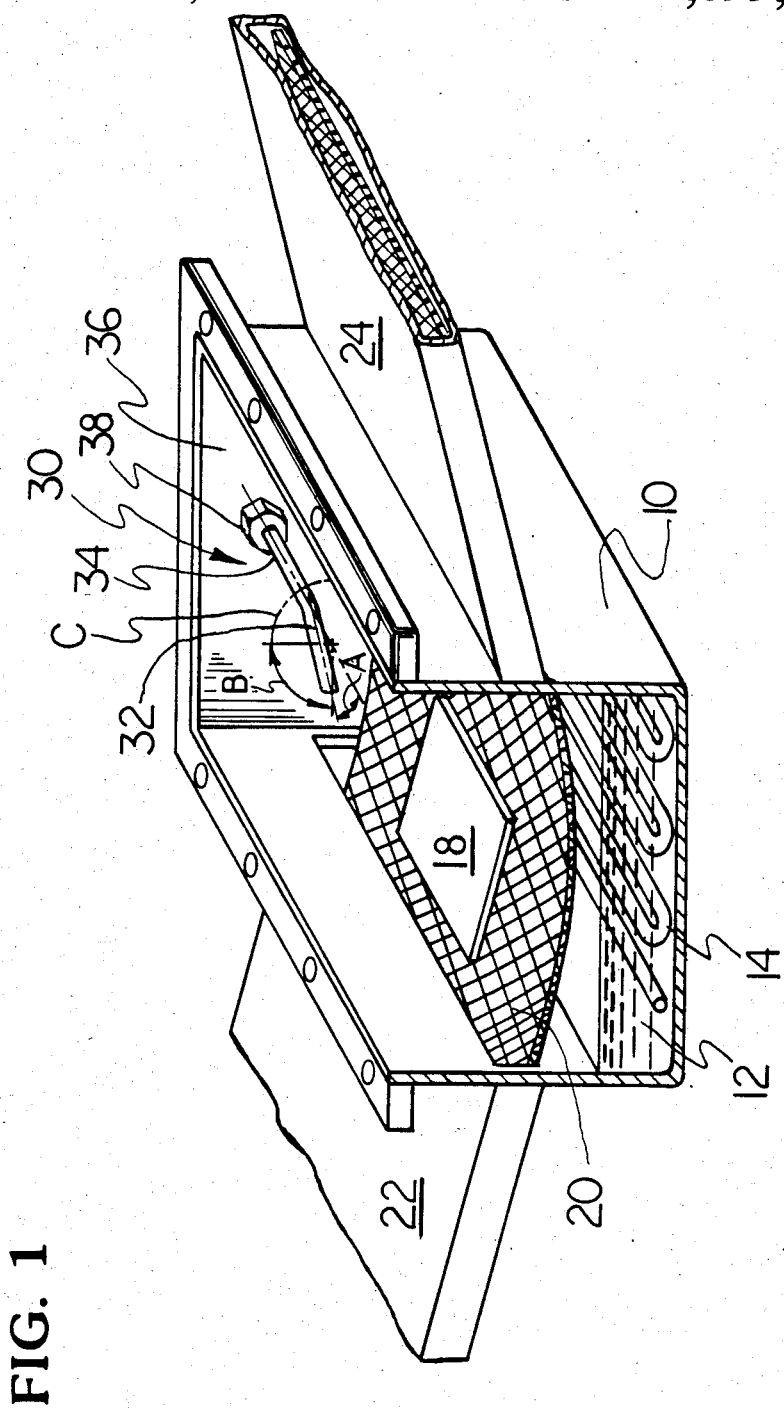

United States Patent [19]

Finney

[11] Patent Number: 4,699,080

[45] Date of Patent: Oct. 13, 1987

[54] TEMPERATURE SENSORS FOR VAPOR PROCESSING SYSTEMS

[75] Inventor: James L. Finney, Hudson, Mass.

[73] Assignee: Dynapert-HTC Corporation, Farmington, Conn.

[21] Appl. No.: 863,749

[22] Filed: May 15, 1986

[51] Int. Cl.⁴ .............................................. B05C 11/02
[52] U.S. Cl. ...................................... 118/666; 118/58; 118/712; 228/8
[58] Field of Search ................. 118/666, 712, 667, 58; 374/179; 228/8, 10; 134/113; 34/73

[56] References Cited

U.S. PATENT DOCUMENTS 2,694,377  11/1954  Pawlyk ................................ 118/666
4,389,797   6/1983  Spigarelli et al. ....................... 34/73
4,389,970   6/1983  Bogerton .............................. 118/666

Primary Examiner—John P. McIntosh
Attorney, Agent, or Firm—Spencer T. Smith

[57] ABSTRACT

A vapor processing system has a vessel for containing a processing vapor into which work product is conveyed for processing. A thermocouple probe generates a signal representative of the actual temperature at one of at least a plurality of spaced locations within the vessel. The probe has a shaft portion and a free end portion defining an angle with the shaft portion and is adapted to be rotatively displaced about the shaft portion to locate the tip of the probe at a selected location around its displacement circle.

3 Claims, 2 Drawing Figures

TEMPERATURE SENSORS FOR VAPOR PROCESSING SYSTEMS

In a vapor phase processing system, an electronic liquid contained within a closed vessel is heated by heaters to generate a zone of saturated vapor. Work product is delivered to the saturated vapor zone and is retained within this zone until processing (soldering, for example) is completed.

It is an object of the present invention to utilize a single thermocouple probe to generate a signal representative of the actual temperature at one of at least a plurality of spaced locations.

Other objects and advantages of the present invention will become apparent from the following portion of the specification and from the following drawings which illustrate in accordance with the mandate of the patent statutes a presently preferred embodiment incorporating the principles of the invention.

Figure 2:
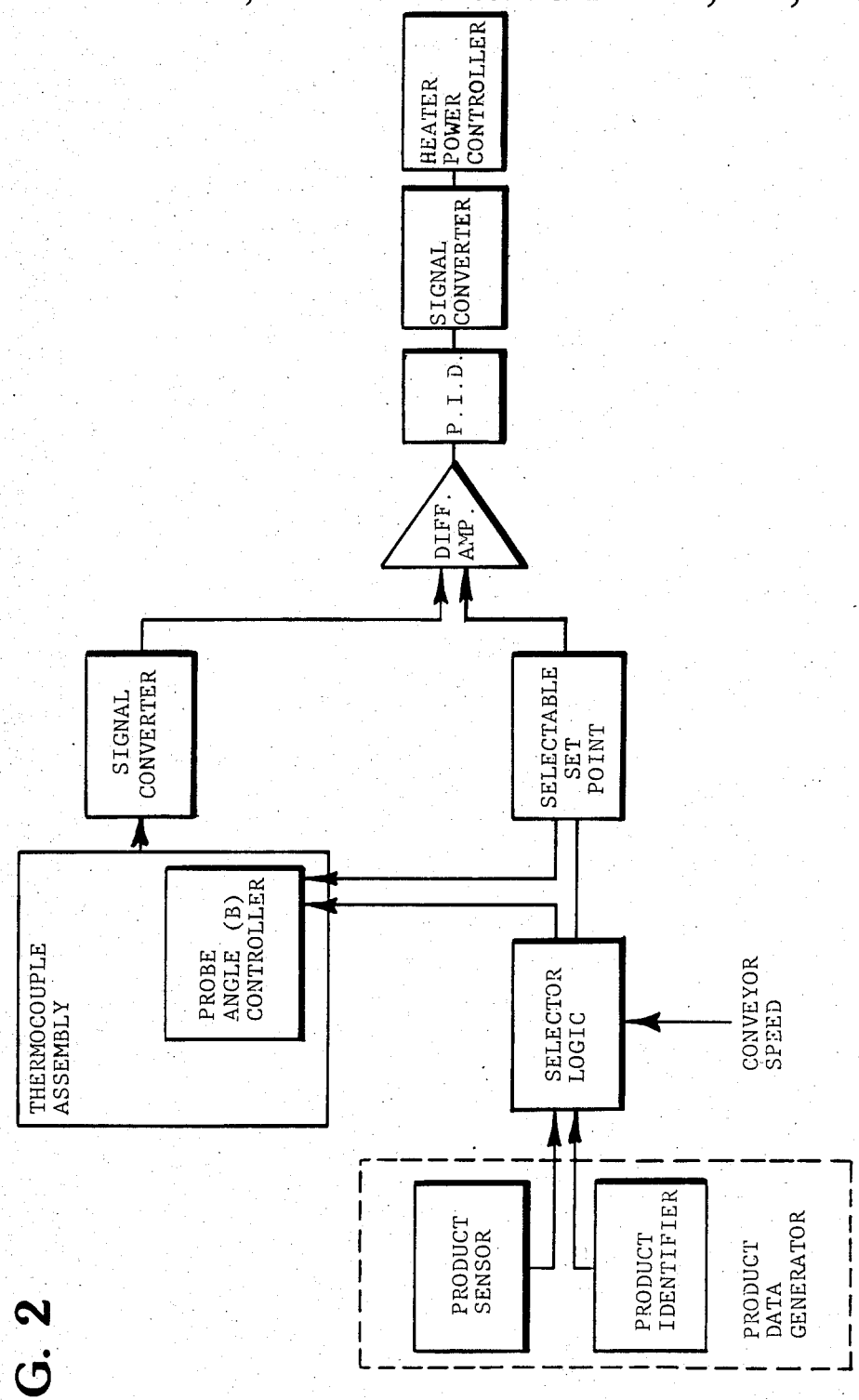

Referring to the drawings:

FIG. 1 is a oblique view of a vapor phase system made in accordance with the teachings of the present invention with the front wall of the vessel removed for clarity; and FIG. 2 is a schematic diagram illustrating the structure for controlling the vapor level of the system shown in FIG. 1.

A vapor phase processing system includes a vessel or tank 10 which contains an electronic liquid 12. The contained electronic liquid 12 is heated by heaters 14 which in this embodiment are located within the electronic liquid 12 to generate a zone of saturated vapor. Work product 18, which may have a variety of shapes, is placed on a conveyor 20 which carries the work product 18 through the inlet throat 22 to the saturated vapor zone for processing and carries the processed work product 18 through the exit throat 24 to a pick up location.

A thermocouple assembly 30 is mounted on the rear wall of the vessel 10. The free end 32 of the thermocouple probe is gently bent to make an angle (A) of approximately 45° with the axis defined by the horizontal shaft 34 of the probe. The temperature sensing tip of the probe may accordingly be selectively located or set at any desired angular location (B) around the axis defined by the shaft 34 to generate a signal representative of the actual temperature at one of at least a plurality of spaced locations within the vessel and can therefore sense the temperature at selected heights.

The top wall 36 of the vessel 10 is transparent so that the vapor level can be observed. The tip of the thermocouple probe can accordingly be manually set by loosening the thermocouple fittings 38 to a position just above the actual or desired level of the vapor.

The thermocouple assembly 30 may also include a Probe Angle (B) Controller which can automatically set the probe tip at any desired angular location around its displacement circle C. This Probe Angle (B) Controller may be selectively set by Selector Logic which operates on data received from a Product Data Generator which can include a Product Sensor for sensing work product at a specific position as it is conveyed through the system. The Product Sensor can, in its simplest form, be an optical switch operated when the work product interrupts the beam of light. The Product Data Generator may also include a Product Identifier which, in its simplest form, can be a thumb wheel switch manually setable to identify the specific work product being processed. Both functions could also be performed by a bar code reader. The Product Data Generator could also be an optical scanning array (not shown) which not only could sense the presence of the work product by locating its leading edge, but could also sense the trailing edge and top surface of the work product, thereby providing the Selector Logic directly with required dimensional data. The Selector Logic, based on this information, as well as on other information such as conveyor speed, commands the Probe Angle (B) Controller to locate the tip of the thermocouple probe at a desired location within the vessel 10 at which the actual temperature is to be read and when and sets the Selectable Set point at the temperature which that thermocouple should sense if the saturated vapor zone has the desired minimum level for processing the work product. The Selectable Set Point may, optionally be manually setable. The output signal from the thermocouple assembly which is converted by a Signal Converter, is delivered with the Selectable Set Point signal to a difference amplifier which supplies a Proportional-Integrator-Derivative Controller (PID). The output of the PID, which is representative of a difference between the actual and desired temperatures at the selected vessel height and which is converted by a Signal Converter, is supplied to the Heater Power Controller to control heater power to eliminate any difference between the actual and desired temperatures at the selected vessel height.

What is claimed is:

1. A vapor processing system comprising
   a vessel for containing a processing vapor,
   heater means for heating an electronic liquid contained within said vessel to establish a saturated vapor zone,
   means for conveying work product to the saturated vapor zone,
   means for generating a signal representative of the actual temperature at one of at least a plurality of spaced vertical locations within said vessel including,
   an elongated thermocouple probe having a temperature sensing end and a mounting end,
   said elongated thermocouple probe being bent between said temperature sensing end and said mounting end to form a non-linear thermocouple probe, and
   means for supporting said thermocouple probe so that said temperature sensing end can be vertically displaced around a displacement circle having a predetermined radius and for securing said thermocouple probe mounting end to said vessel with said sensing end at a selected location around said displacement circle.

2. A vapor processing system according to claim 1, wherein said vessel includes a transparent top portion for permitting viewing of said thermocouple probe.

3. A vapor phase processing system according to claim 1, further comprising means for controlling the output of said heater means so that a desired temperature will be sensed by said selectively located thermocouple probe temperature sensing end.

* * * * *